United States Patent
Suzunaga

(10) Patent No.: US 7,787,780 B2
(45) Date of Patent: Aug. 31, 2010

(54) OPTICAL SIGNAL RECEIVING CIRCUIT

(75) Inventor: Hiroshi Suzunaga, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 831 days.

(21) Appl. No.: 11/445,306

(22) Filed: Jun. 2, 2006

(65) Prior Publication Data

US 2006/0273243 A1 Dec. 7, 2006

(30) Foreign Application Priority Data

Jun. 2, 2005 (JP) ............................... 2005-162664

(51) Int. Cl.
*H03F 3/08* (2006.01)
(52) U.S. Cl. ............... 398/210; 250/214 A; 250/214 R; 330/308; 330/254
(58) Field of Classification Search ................. 398/210; 330/308
See application file for complete search history.

(56) References Cited

U.S. PATENT DOCUMENTS

| | | | |
|---|---|---|---|
| 5,182,448 A * | 1/1993 | Ohtsuka et al. | 250/214 B |
| 6,038,049 A * | 3/2000 | Shimizu et al. | 398/210 |
| 6,072,366 A * | 6/2000 | Maeda et al. | 330/254 |
| 6,201,235 B1 * | 3/2001 | Takeuchi et al. | 250/214 AG |
| 6,342,694 B1 * | 1/2002 | Satoh | 250/214 A |
| 6,737,623 B2 | 5/2004 | Suzunaga et al. | |
| 6,781,468 B1 * | 8/2004 | Robinson et al. | 330/308 |
| 6,885,249 B2 * | 4/2005 | Suzunaga | 330/308 |
| 7,406,268 B2 * | 7/2008 | Schrodinger | 398/202 |
| 7,421,213 B2 * | 9/2008 | Harms et al. | 398/210 |
| 7,449,669 B2 * | 11/2008 | Sakura | 250/214 A |
| 7,635,837 B2 * | 12/2009 | Uo et al. | 250/214 A |
| 7,663,089 B2 * | 2/2010 | Sakura | 250/214 A |
| 2003/0025533 A1 * | 2/2003 | Akita et al. | 327/71 |
| 2004/0100317 A1 * | 5/2004 | Suzunaga | 327/307 |
| 2005/0017761 A1 * | 1/2005 | Akita et al. | 327/63 |
| 2007/0075751 A1 * | 4/2007 | Furuya et al. | 327/112 |

FOREIGN PATENT DOCUMENTS

JP 08-236804 9/1996

OTHER PUBLICATIONS

U.S. Appl. No. 11/445,306, filed Jun. 2, 2006, Suzunaga.
U.S. Appl. No. 11/470,356, filed Sep. 6, 2006, Furuya et al.

* cited by examiner

*Primary Examiner*—Ken N Vanderpuye
*Assistant Examiner*—Tanya Ngo
(74) *Attorney, Agent, or Firm*—Oblon, Spivak, McClelland, Maier & Neustadt, L.L.P.

(57) ABSTRACT

An optical signal receiving circuit, may include a first transimpedance amplifier configured to convert a first current signal into a first voltage signal, wherein the first current signal generated in a first photodiode, to which an optical signal is inputted; a second transimpedance amplifier configured to convert a second current signal into a second voltage signal, wherein the second current signal generated in a second photodiode, to which an optical signal is inputted; a noise detection circuit configured to detect a noise signal of the second voltage signal, and configured to shift at least one of the first voltage and the second voltage in order to widen a voltage difference between the first voltage signal and the second voltage signal when the noise signal of the second voltage signal is detected; and a first comparator having as inputs the first voltage signal and the second voltage signal, and configured to generate a digital signal based on the first voltage signal and the second voltage signal.

5 Claims, 22 Drawing Sheets

OPTICAL SIGNAL RECEIVING CIRCUIT

CROSS REFERENCE TO RELATED APPLICATION

This application is based upon and claims the benefit of priority from Japanese Patent Application No. P2005-162664, filed on Jun. 2, 2005, the entire contents of which are incorporated herein by reference.

BACKGROUND OF THE INVENTION

An optical semiconductor device, such as a photocoupler having a light emitting element and a light receiving element, is widely used for isolating a control circuit of high power control device and an output stage thereof.

An optical signal receiving circuit, which is applicable to the photocoupler, is disclosed such as U.S. Pat. No. 6,885,249.

SUMMARY

Aspects of the invention relate to an improved optical signal receiving circuit.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings, wherein.

Figure 16:
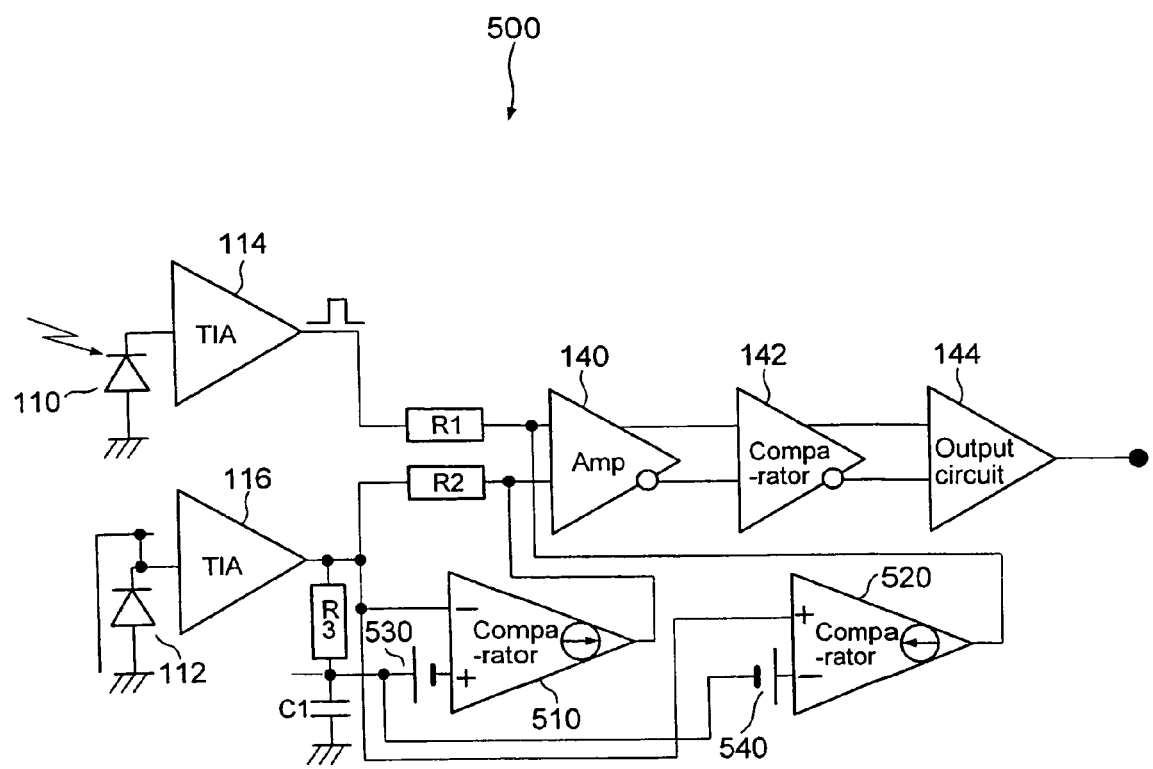
Figure 17:
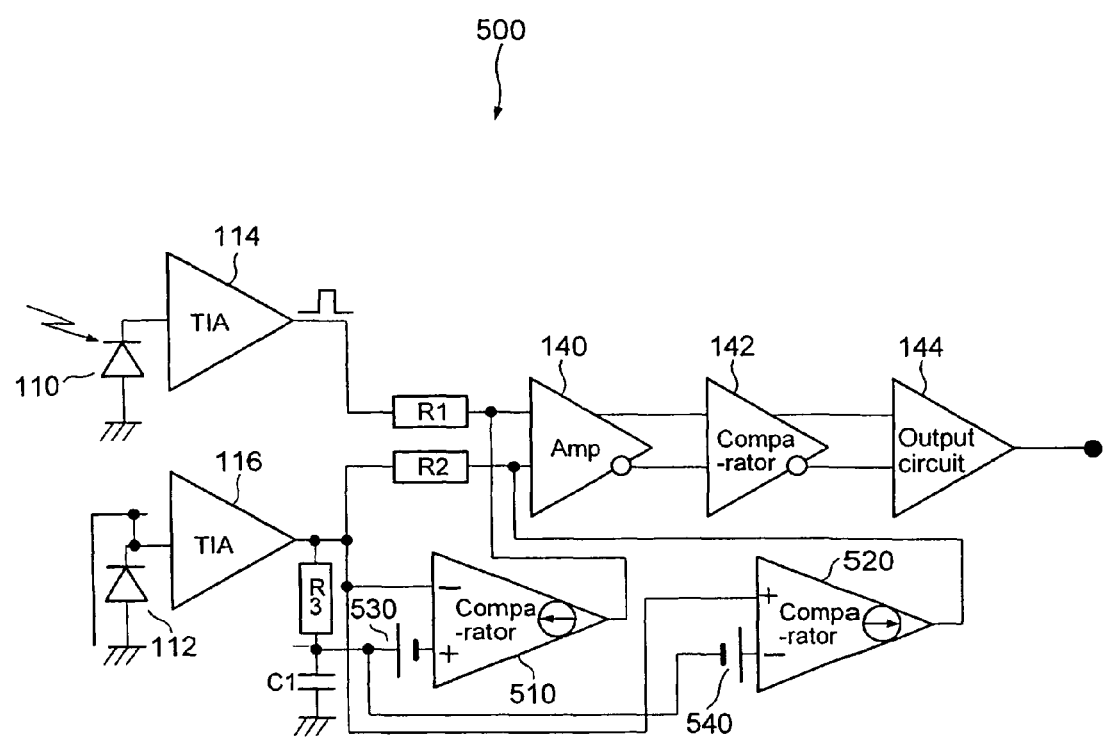
Figure 18:
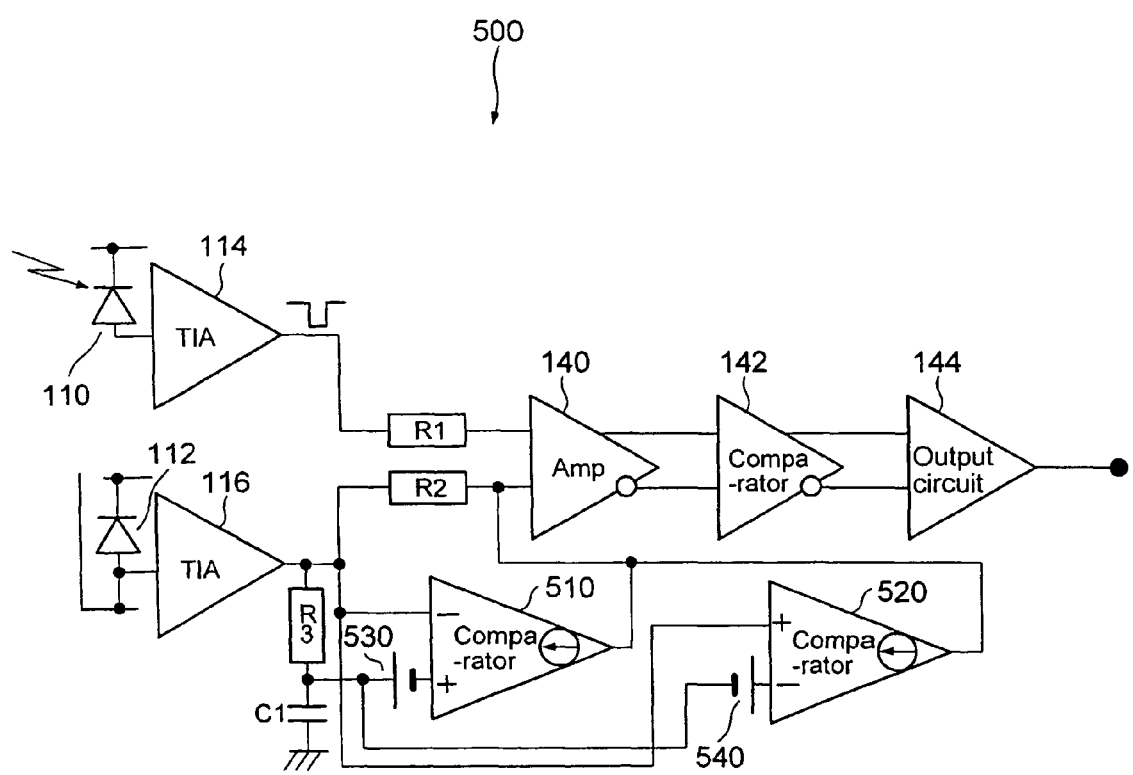
Figure 19:
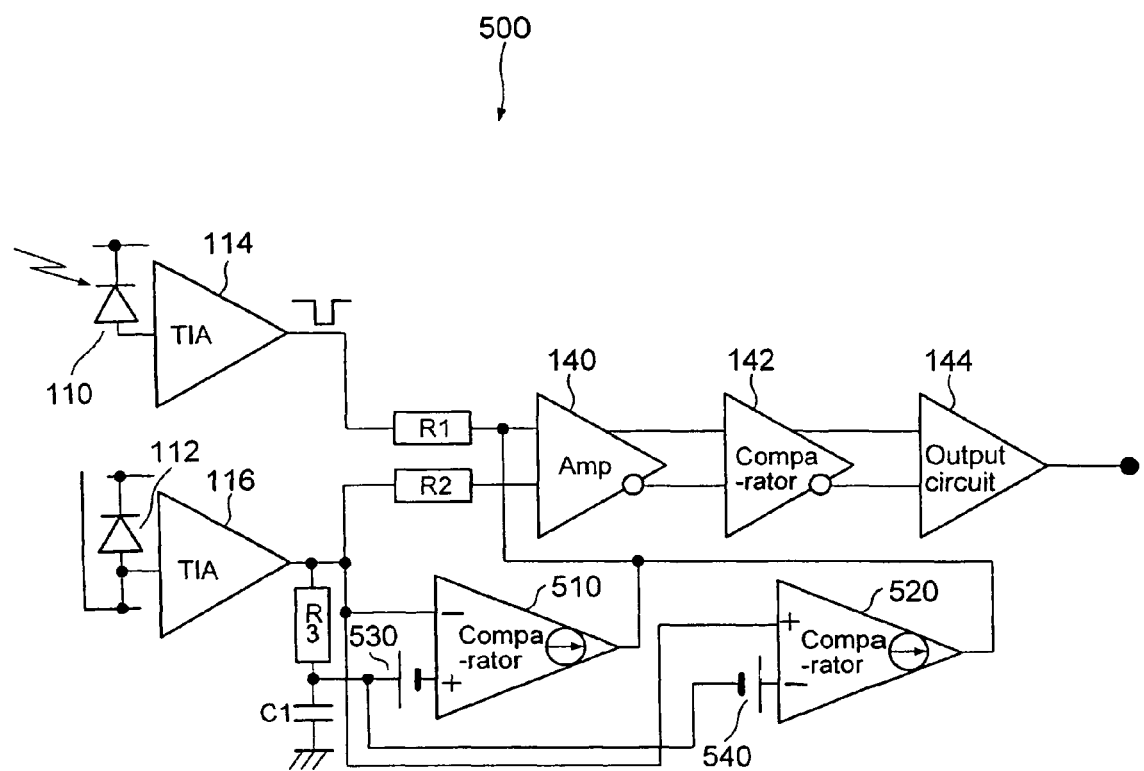
Figure 20:
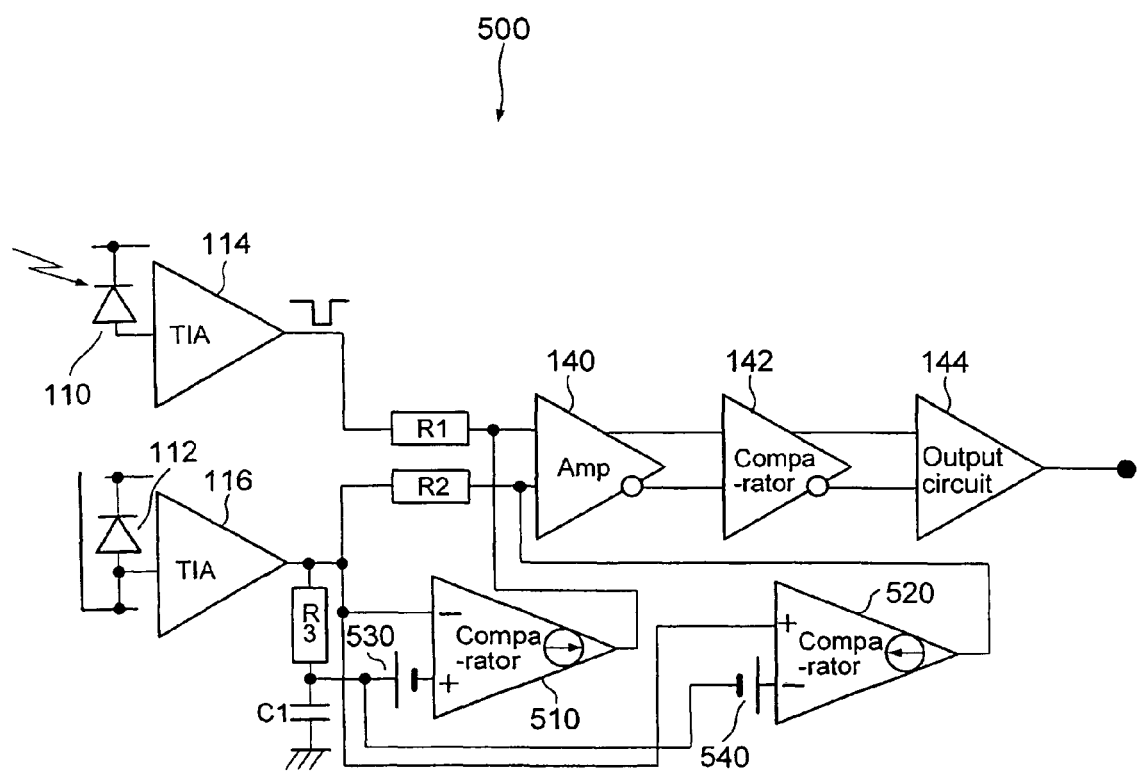
Figure 21:
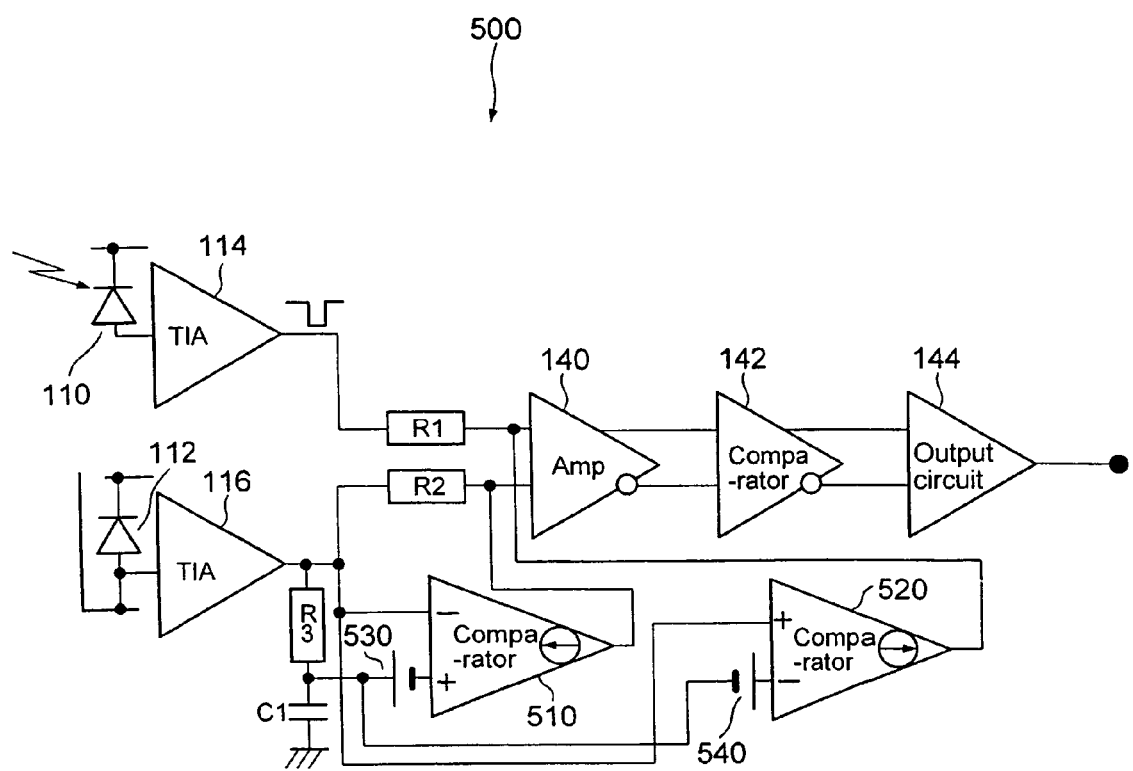
Figure 22:
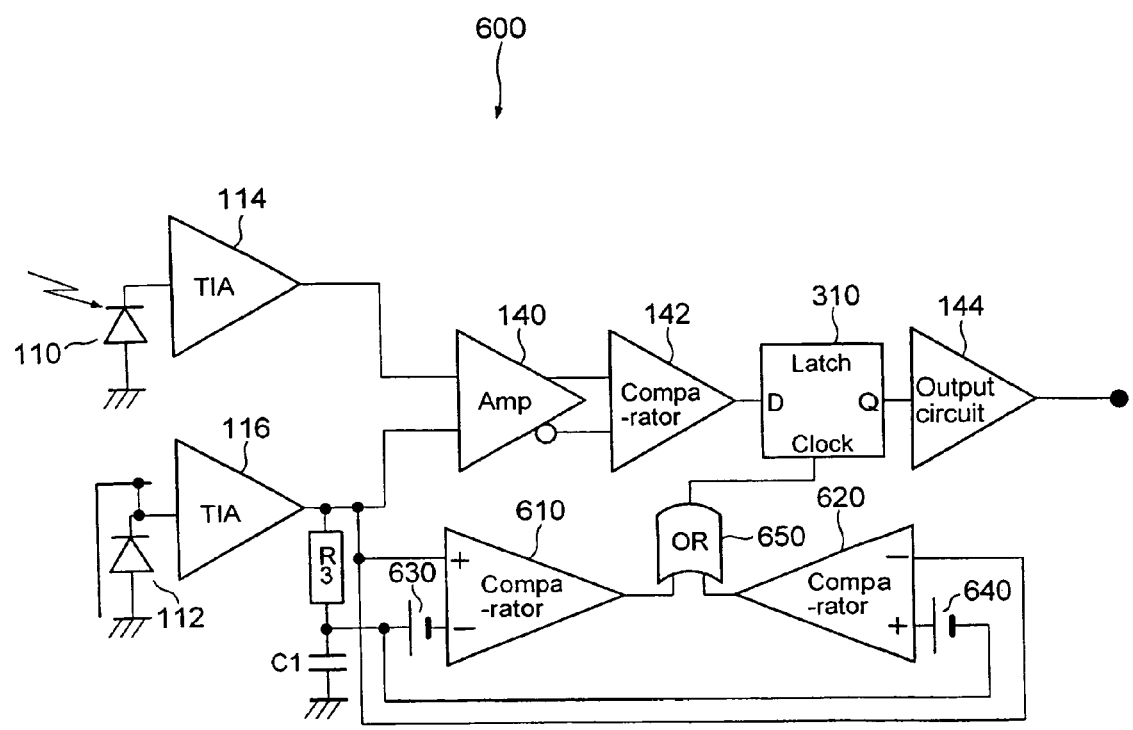

FIG. 16 is a circuit diagram of an optical signal receiving circuit in accordance with a second modification of the fifth embodiment FIG. 17 is a circuit diagram of an optical signal receiving circuit in accordance with a third modification of the fifth embodiment FIG. 18 is a circuit diagram of an optical signal receiving circuit in accordance with a fourth modification of the fifth embodiment FIG. 19 is a circuit diagram of an optical signal receiving circuit in accordance with a fifth modification of the fifth embodiment FIG. 20 is a circuit diagram of an optical signal receiving circuit in accordance with a sixth modification of the fifth embodiment FIG. 21 is a circuit diagram of an optical signal receiving circuit in accordance with a seventh modification of the fifth embodiment FIG. 22 is a circuit diagram of an optical signal receiving circuit in accordance with a sixth embodiment of the present invention.

DETAILED DESCRIPTION OF THE INVENTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as follows.

General Overview

In one aspect of the present invention, an optical signal receiving circuit may include a first transimpedance amplifier configured to convert a first current signal into a first voltage signal, wherein the first current signal generated in a first photodiode, to which an optical signal is inputted; a second transimpedance amplifier configured to convert a second current signal into a second voltage signal, wherein the second current signal generated in a second photodiode, to which an optical signal is inputted; a noise detection circuit configured to detect a noise signal of the second voltage signal, and configured to shift at least one of the first voltage and the second voltage in order to widen a voltage difference between the first voltage signal and the second voltage signal when the noise signal of the second voltage signal is detected; and a first comparator having as inputs the first voltage signal and the second voltage signal, and configured to generate a digital signal based on the first voltage signal and the second voltage signal.

In another aspect of the invention, the noise detection circuit is configured to shift at least one of the first voltage signal and the second voltage signal when the noise detection circuit detects a large amplitude noise.

First Embodiment

A first embodiment of the present invention will be explained hereinafter with reference to FIGS. 1-6.

Figure 1:
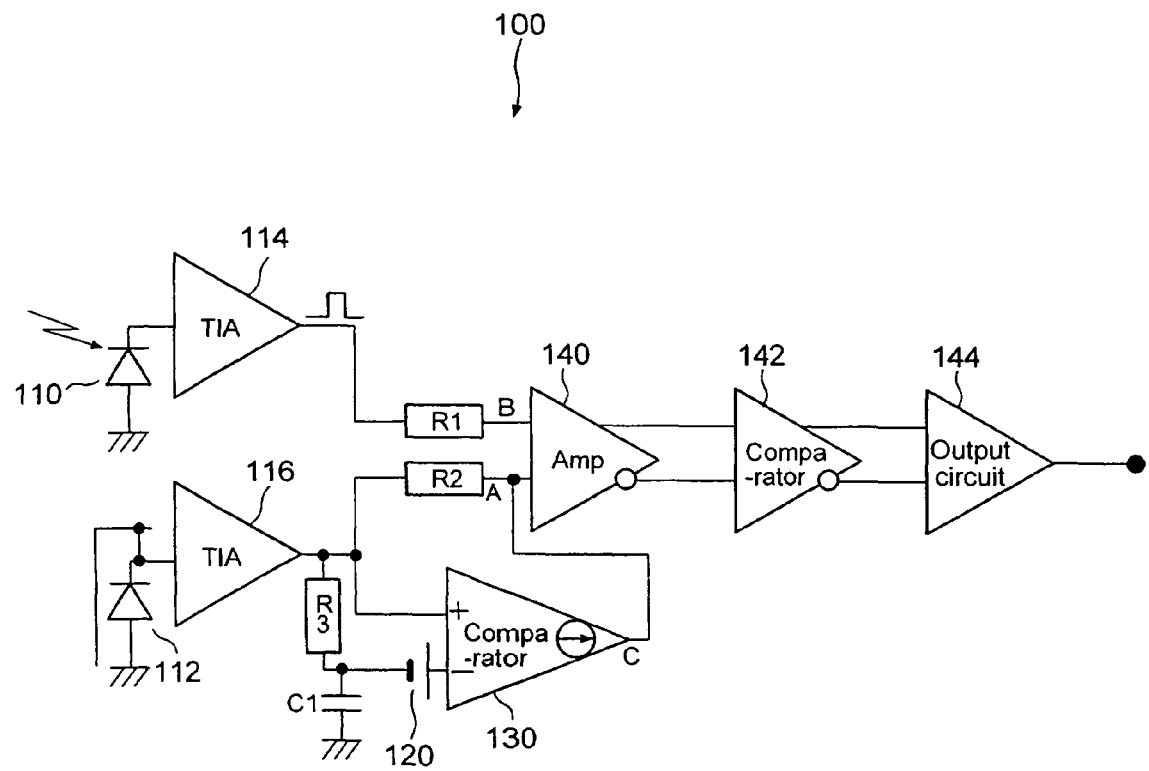
FIG. 1 is a circuit diagram of an optical signal receiving circuit in accordance with a first embodiment of the present invention.

FIG. 1 is a circuit diagram of an optical signal receiving circuit in accordance with a first embodiment. As shown in FIG. 1, an optical signal receiving circuit 100 has photodiodes 110, 112, transimpedance amplifiers (TIA) 114, 116, resistances R1, R2, R3, a capacitance C1, a voltage source 120, a comparator 130, a differential amplifier 140, a comparator 142, and an output circuit 144.

An optical signal inputted to the photodiode 110 is converted into a current signal. The current signal is inputted to the transimpedance amplifier 114. The current signal is converted into a voltage signal by the transimpedance amplifier 114, and the voltage signal is outputted from the transimpedance amplifier 114.

On the other hand, the photodiode 112 is a dummy photodiode, which has a same photo receiving area as the photodiode 110, and is covered with a light shield, which is made of metal and connected to an output terminal (a cathode in FIG. 1) of the photodiode 112. A noise signal generated from an electrostatic coupling is inputted to the transimpedance amplifier 116, since the shield is connected to an input terminal of the transimpedance amplifier 116. So an electrostatic ambient of the photodiode 112 is similar to an electrostatic ambient of the photodiode 110. The output terminal of the photodiode 112 is connected to the transimpedance amplifier 116, which is substantially same structure as the transimpedance amplifier 114. The electrostatic noise inputted to the shield of the photodiode 112 is converted into a voltage signal by the transimpedance amplifier 116.

A voltage signal outputted from the transimpedance amplifiers 114, 116 is inputted to the differential amplifier 140, which is a next stage thereof, via the resistance R1, R2, respectively. A differential signal between the voltage signal outputted from the transimpedance amplifier 114 and the voltage signal outputted from the transimpedance amplifier 116 is amplified by the differential amplifier 140, and outputted. The output signal from the differential amplifier 140 is inputted to the comparator 142, and the waveform of the output signal is adjusted to a digital signal by the comparator 142. An output signal of the comparator 142 is amplified by the output circuit 144, and a digital signal, such as TTL (Transistor Transistor Logic) or ECL (Emitter Couple Logic) is outputted from the output circuit 144.

The voltage signal outputted from the transimpedance amplifier 116 is inputted to a non-inverting input terminal (+) of the comparator 130, and a reference voltage, which is outputted from the voltage source 120, is inputted to an inverting input terminal (−) of the comparator 130.

When an electrostatic noise, which shifts the output of the transimpedance amplifier 114, 116 to the positive direction, is inputted to the photodiodes 110, 112, the noises appeared at the output of the transimpedance amplifier 114, 116 are substantially the same positive signals. In case the noise is not so large, the noise does not appear at the output of the differential amplifier 140, because of a common mode rejection of the differential amplifier 140.

Figure 2:
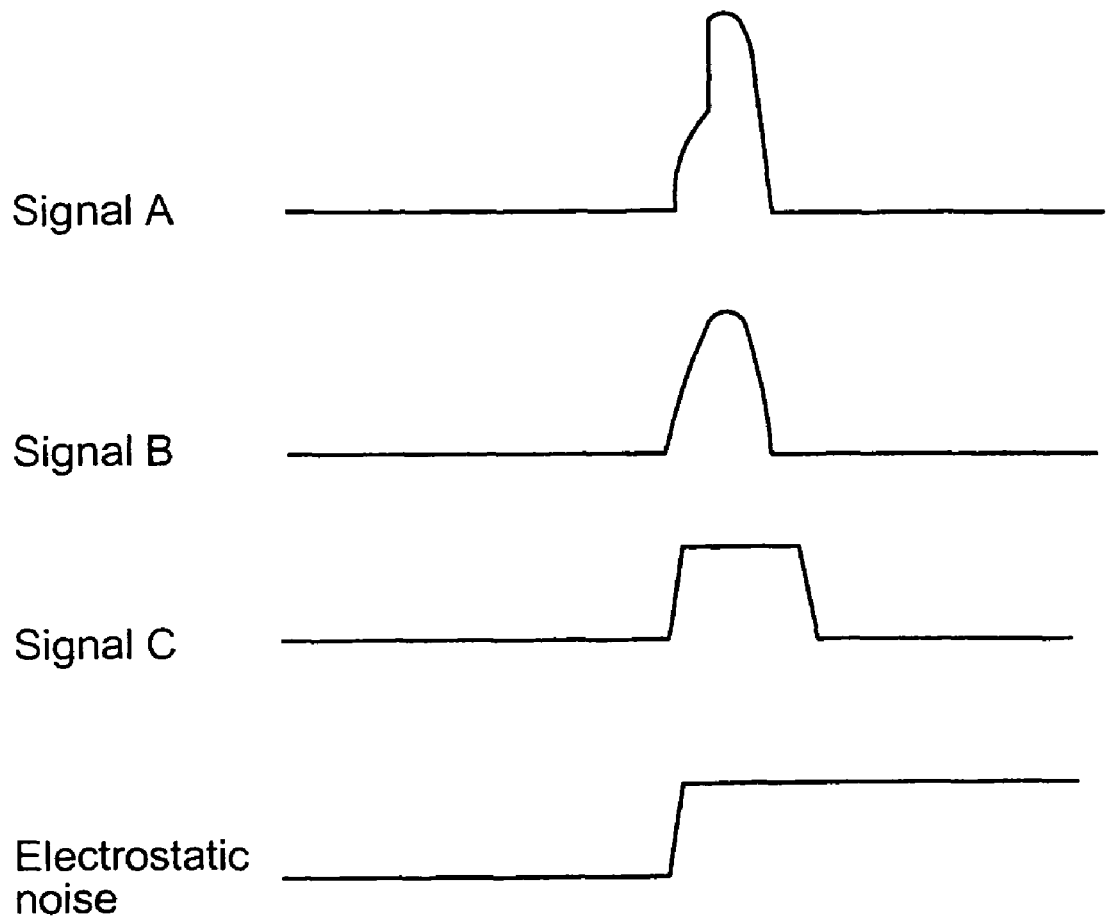
FIG. 2 is a waveform of nodes of the optical signal receiving circuit as shown in FIG. 1.

As shown in FIG. 2, when an electrostatic noise which is in a positive direction and larger than a predetermined value, is inputted to the photodiode 110, the voltage signal outputted from the transimpedance amplifier 116 is larger than a threshold voltage of the voltage source 120, and current as shown in Signal C is outputted from the comparator 130 and frown to the resistance R2. The Signal A which is a voltage signal at the reference terminal of the differential amplifier 140 is shifted up by the current flown to the resistance R2. In case Signal B, which is an output signal of the transimpedance amplifier 114, is shifted to a positive direction largely by the electrostatic noise, the Signal A is also shifted to the positive direction largely. So the electrostatic noise is not outputted at the output of the differential amplifier 140.

The resistance R3 and the capacitance C1 function as a high cut filter, which remove abrupt noise signal and provide a reference voltage to the comparator 130. The resistance R1 may be a same resistance as the resistance R2 so as to avoid an offset at the input terminals of the differential amplifier 140 by a bias current of the differential amplifier 140. A threshold voltage, which is a reference voltage of the comparator for outputting an output current, is created by the voltage source 120. The voltage source 120 and the comparator 130 constitute a noise detection circuit.

Figure 3:
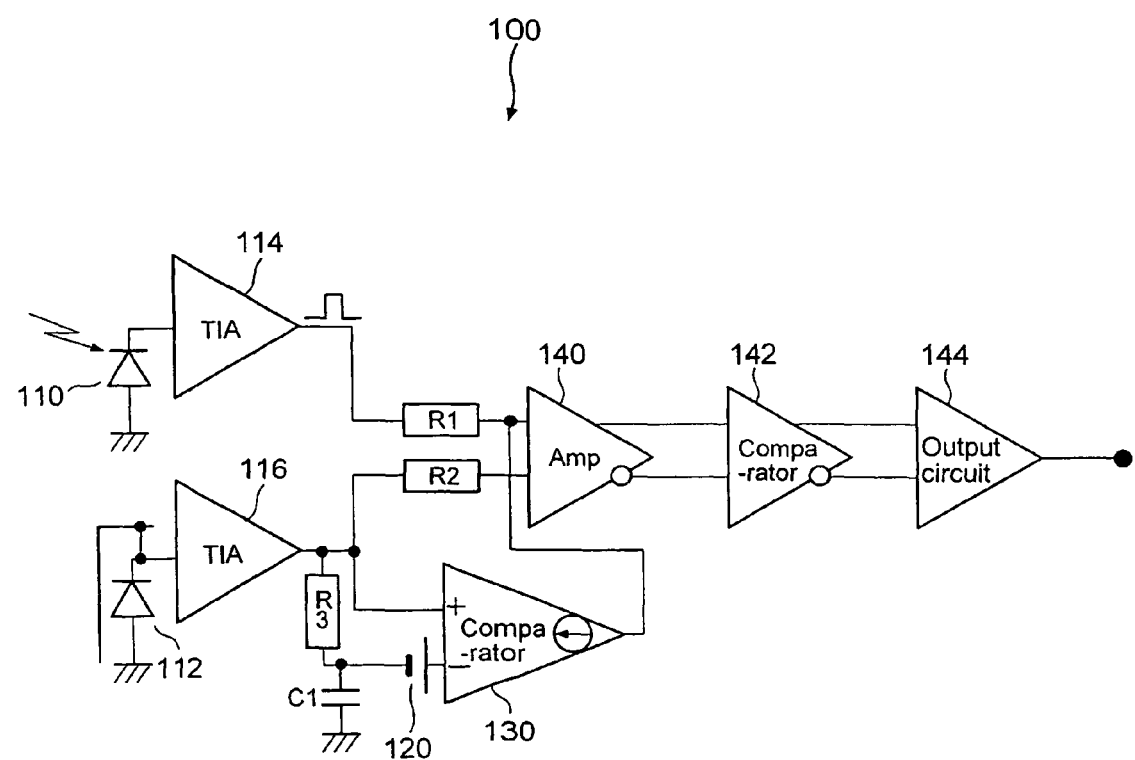
FIG. 3 is a circuit diagram of an optical signal receiving circuit in accordance with a first modification of the first embodiment.

In this first embodiment, as shown in FIG. 3, the output of the comparator 130 is an opposite direction of the comparator 130 shown in FIG. 1 and connected to a node between the R1 and the input signal terminal of the differential amplifier 140. In this case, when the voltage signal outputted from the transimpedance amplifier 114 is swung to the positive direction largely by the electrostatic noise generated at the photodiode 110, the comparator 130 drops the voltage signal. So the voltage signal at the transimpedance amplifier 114 side (signal terminal) of the input terminal in the transimpedance amplifier 140 is not greater than the voltage signal at the input terminal of the reference side of the input terminal in the transimpedance amplifier 140, and the noise signal is hardly outputted from the differential amplifier 140.

Figure 4:
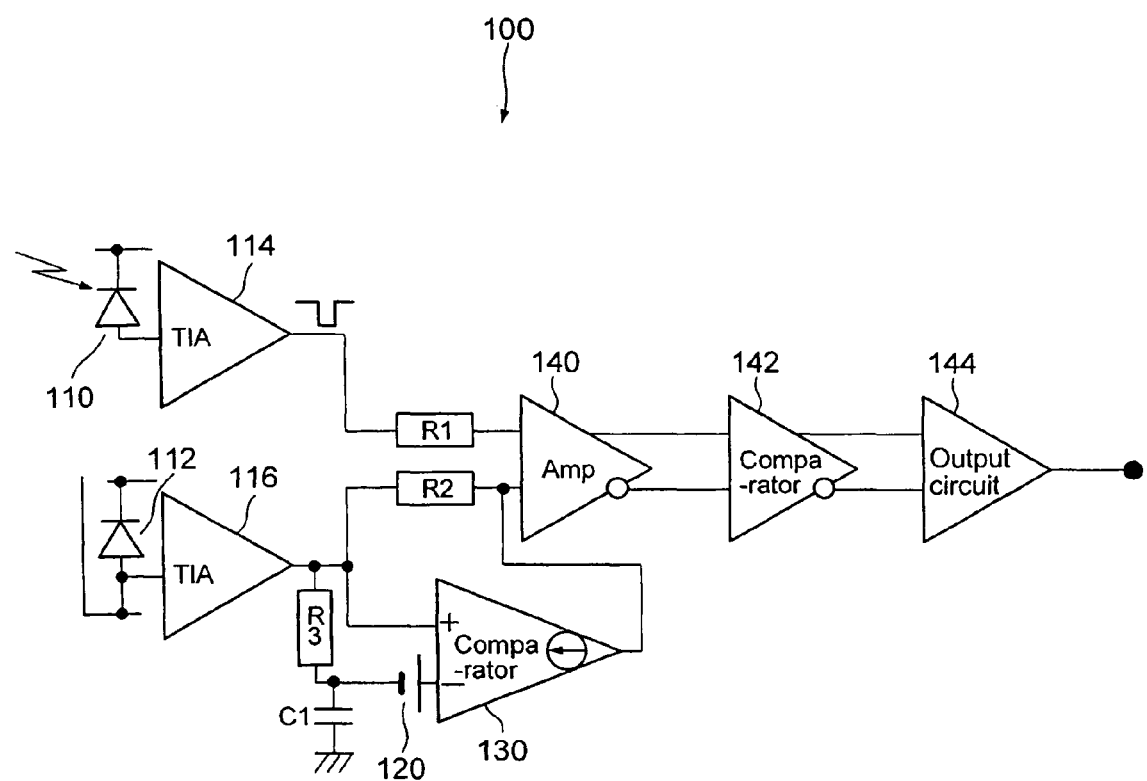
FIG. 4 is a circuit diagram of an optical signal receiving circuit in accordance with a second modification of the first embodiment.
Figure 5:
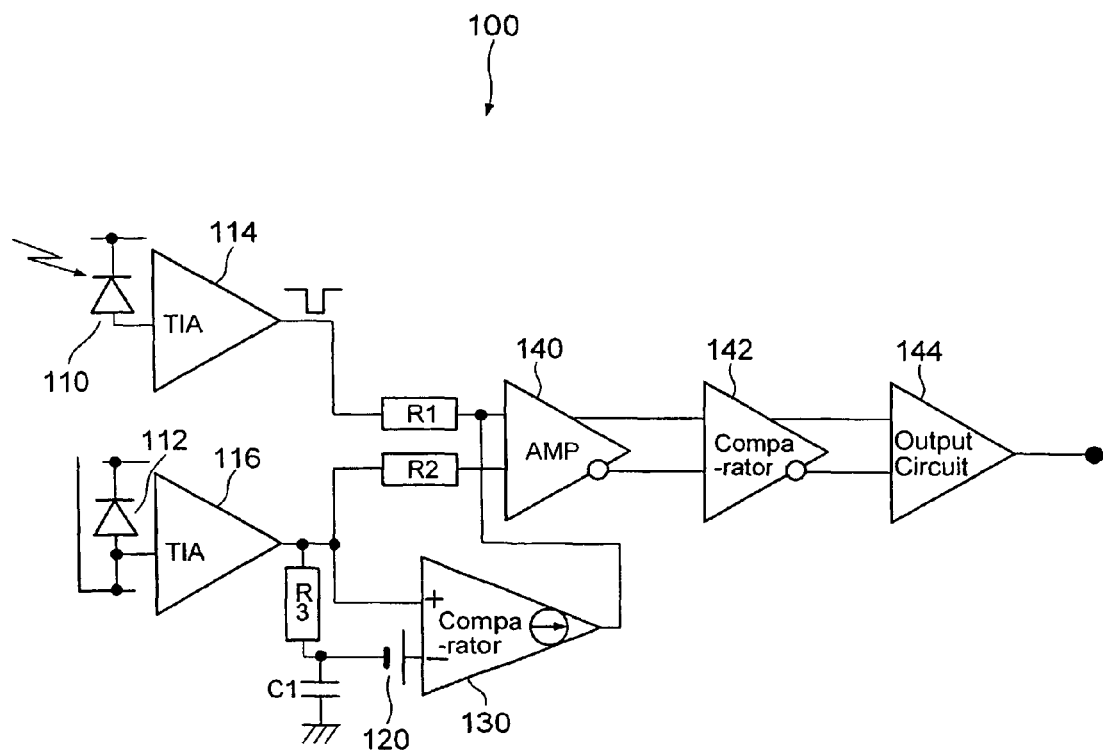
FIG. 5 is a circuit diagram of an optical signal receiving circuit in accordance with a third modification of the first embodiment.

FIGS. 4 and 5 are circuit diagrams of the optical receiving circuit, in which the output of the transimpedance amplifiers 114, 116 drops when the photodiodes 110, 112 detect the light of the optical signal. In FIGS. 4, 5, the light shield is connected to the anode of the photodiode 112. So, the electrostatic noise generated at the photodiode 112 is inputted to the transimpedance amplifier 116.

As shown in FIG. 4, the comparator 130 may be connected to the reference voltage terminal of the differential amplifier 140, and the comparator 130 is configured to extract a current from the reference voltage terminal, when the positive noise which swings to greater than a predetermined threshold voltage in a positive direction, is inputted to the transimpedance amplifier 114, 116.

Alternatively, as shown in FIG. 5, the comparator 130 may be connected to the signal terminal of the differential amplifier 140, and the comparator 130 is configured to add a current to the signal voltage terminal, when the noise which swings to greater than a predetermined threshold voltage in a positive direction, is inputted the transimpedance amplifier 114, 116.

In the optical signal receiving circuit as shown in FIG. 1, 3, 4 or 5, when the positive direction noise signal, which is greater than a predetermined threshold voltage, is detected, the comparator 130 widens a voltage difference between the output of the transimpedance amplifier 114 and the output of the transimpedance amplifier 116. So the differential amplifier 140 may not output a noise signal.

Figure 6:
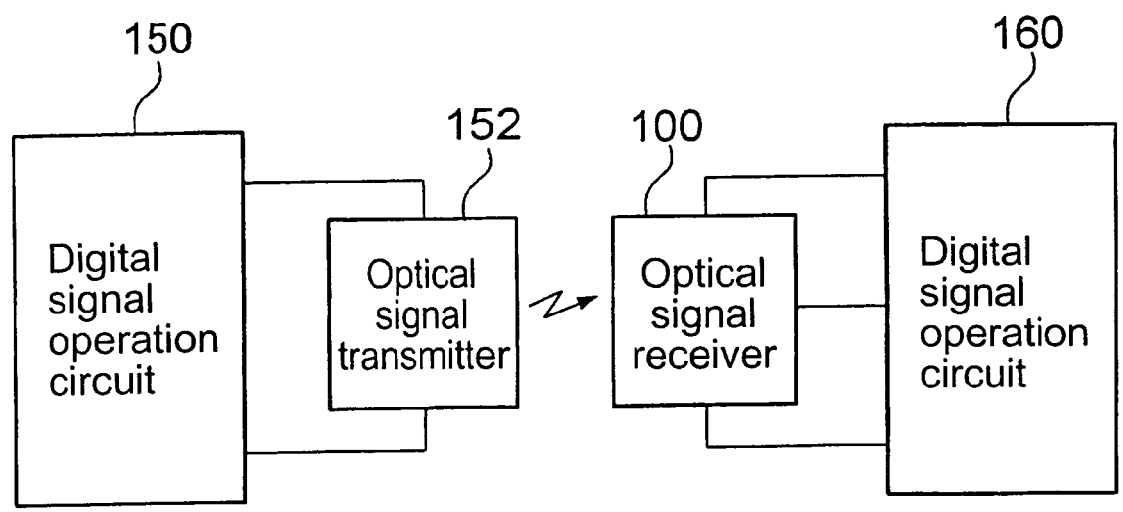
FIG. 6 is a block diagram of a photocoupler in accordance with a first embodiment of the present invention.

FIG. 6 is a block diagram of the photocoupler, which has the optical receiving circuit 100 of this embodiment. As shown in FIG. 6, a digital signal, which is an electrical signal, operated in a digital signal operation circuit 150 is converted into an optical signal in an optical signal transmitter 152, and outputted. An optical signal receiver 100 receives the optical signal emitted from the optical signal transmitter 152, converts the optical signal into a digital signal, which is an electric signal, and is output to a digital signal operation circuit 160. The digital signal operation circuit 160 operates based on the digital signal from the optical signal receiver 100.

Second Embodiment

A second embodiment is explained with reference to FIGS. 7-10.

An optical signal receiving circuit 200 is described in accordance with a second embodiment of the present invention. With respect to each portion of this embodiment, the same or corresponding portions of the optical signal receiving circuit 100 of the first embodiment shown in FIGS. 1-6 are designated by the same reference numerals, and explanation of such portions is omitted.

In this second embodiment, the inverting input terminal and the non-inverting terminal are interchanged and the direction of the voltage source 120 is changed, with comparing to the comparator 130 in the first embodiment. So in case a noise, which swings the voltage signal to a negative direction and has greater amplitude than a predetermined threshold voltage is inputted, the voltage signal at the reference voltage terminal shifts up such that the noise is not outputted from the differential amplifier 140.

Figure 7:
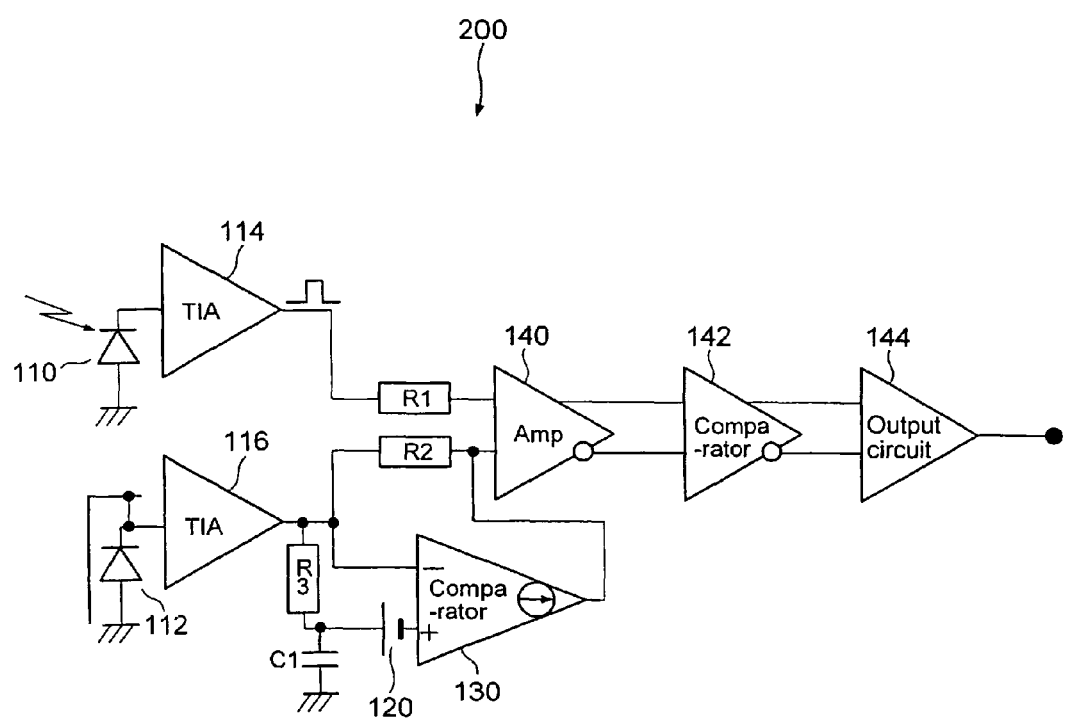
FIG. 7 is a circuit diagram of an optical signal receiving circuit in accordance with a second embodiment of the present invention.

FIG. 7 is a circuit diagram of the optical receiving circuit 200 in accordance with this second embodiment. As shown in FIG. 7, the voltage source 120 is connected to a non-inverting input terminal of the comparator 130, and the output of the transimpedance amplifier 116 is connected to the inverting input terminal of the comparator 130. The negative terminal of the voltage source 120 is connected to the non-inverting input terminal of the comparator 130, and the positive terminal of the voltage source is connected to the resistance R3 and capacitance C1.

In case a negative noise, which swings the output signal of the transimpedance amplifier 114 to a negative direction, is inputted to the photodiodes 110, the substantially same negative direction noise signal is outputted to the output terminal of the transimpedance amplifiers 114, 116. If the noise is not so large (or below the predetermined threshold), the noise does not appear at the output of the differential amplifier 140, because of a common mode rejection of the differential amplifier 140.

When an electrostatic negative direction noise which is larger than a predetermined value and swings to the negative direction, is inputted to the photodiode 110, the voltage signal outputted from the transimpedance amplifier 116 is smaller than a threshold voltage of the voltage source 120, and a current is outputted from the comparator 130 and to the resistance R2. The reference terminal of the differential amplifier 140 is shifted up by the current flown to the resistance R2. In case an output signal of the transimpedance amplifier 114 is shifted to a negative direction largely by the electrostatic noise, the reference input terminal of the differential amplifier 140 is shifted up to the positive direction largely. So the electrostatic noise is not outputted at the output of the differential amplifier 140.

Figure 8:
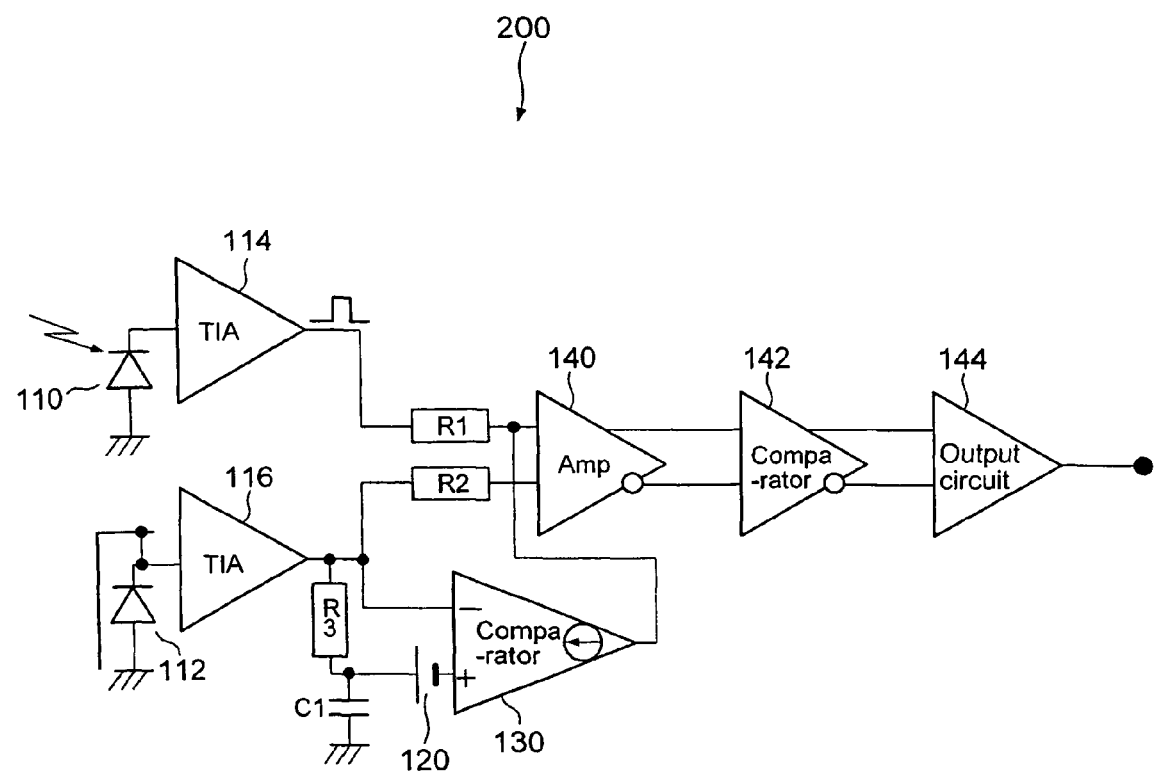
FIG. 8 is a circuit diagram of an optical signal receiving circuit in accordance with a first modification of the second embodiment.

In this second embodiment, as shown in FIG. 8, the output of the comparator 130 may be an opposite direction of the comparator shown in FIG. 7 and connected to a node between the R1 and the signal terminal of the differential amplifier 140. In this case, when the voltage signal outputted from the transimpedance amplifier 114 is swung to the negative direction largely by the electrostatic noise generated at the photodiode 110, the comparator 130 drops the voltage signal. So the voltage signal at the transimpedance amplifier 114 side of the input terminal in the transimpedance amplifier 140 is not greater than the voltage signal at the input terminal of the reference side of the input terminal in the transimpedance amplifier 140, and the noise signal is hardly outputted from the differential amplifier 140.

Figure 9:
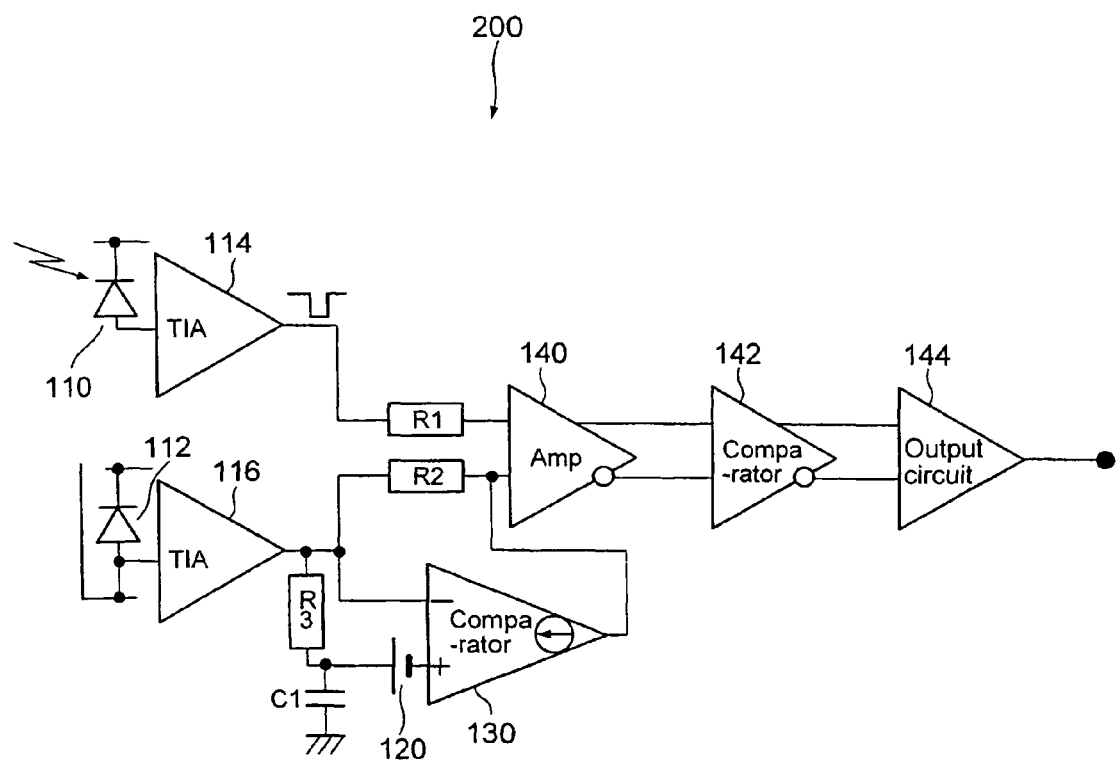
FIG. 9 is a circuit diagram of an optical signal receiving circuit in accordance with a second modification of the second embodiment.
Figure 10:
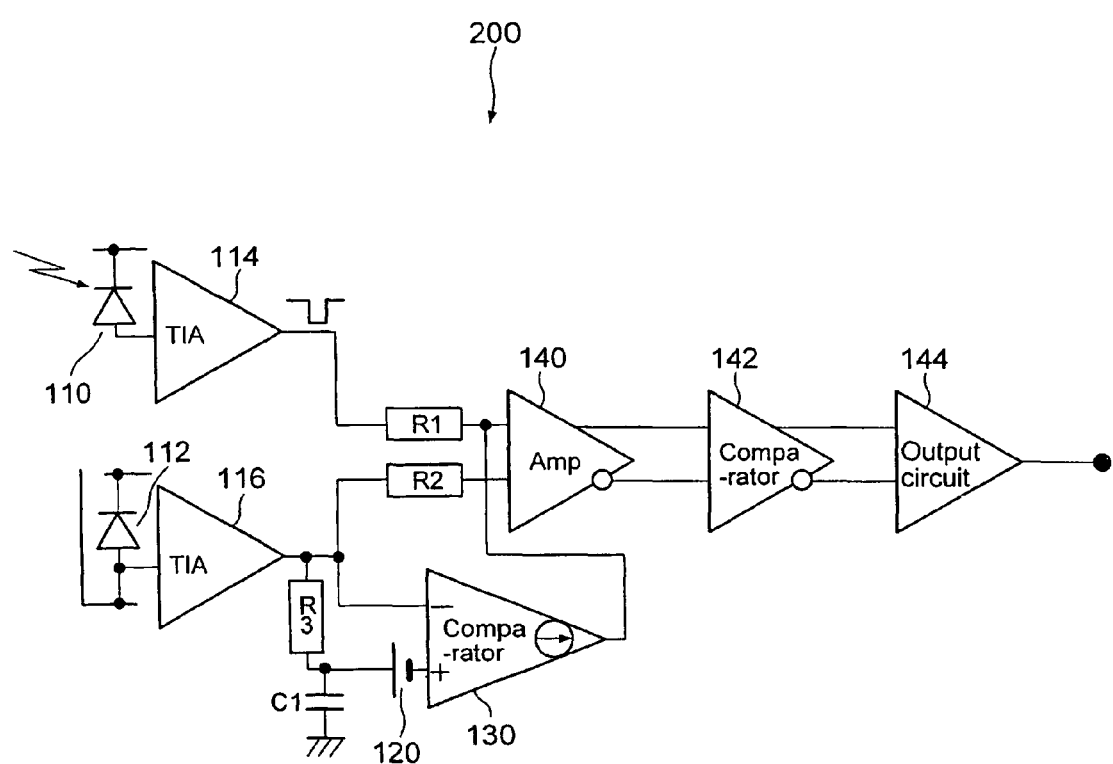
FIG. 10 is a circuit diagram of an optical signal receiving circuit in accordance with a third modification of the second embodiment.

FIGS. 9 and 10 are circuit diagrams of the optical receiving circuit, in which the output of the transimpedance amplifiers 114, 116 drops when the photodiodes 110, 112 detect the light of the optical signal. In FIGS. 9, 10, the light shield is connected to the anode of the photodiode 112. So, the electrostatic noise generated at the photodiode 112 is inputted to the transimpedance amplifier 116.

As shown in FIG. 9, the comparator 130 may be connected to the reference terminal of the differential amplifier 140, and the comparator 130 is configured to extract a current from the reference voltage terminal, when the negative noise which swings to greater than a predetermined threshold voltage in a negative direction, is inputted the transimpedance amplifier 114, 116.

Alternatively, the comparator 130 may be connected to the signal voltage terminal of the differential amplifier 140, and the comparator 130 is configured to add a current to the signal voltage terminal, when the noise which swings to greater than a predetermined threshold voltage in a positive direction, is inputted the transimpedance amplifier 114, 116.

In the optical signal receiving circuit as shown in FIGS. 7-10, when the negative direction noise signal which is greater than a predetermined threshold voltage is detected, the comparator 130 widens a voltage difference between the output of the transimpedance amplifier 114 and the output of the transimpedance amplifier 116. So the differential amplifier 140 may not output a noise signal.

Third Embodiment

A third embodiment is explained with reference to FIGS. 11 and 12.

An optical signal receiving circuit 300 is described in accordance with a third embodiment of the present invention. With respect to each portion of this embodiment, the same or corresponding portions of the optical signal receiving circuit 100 or 200 of the first or the second embodiment shown in FIGS. 1-10 are designated by the same reference numerals, and explanation of such portions is omitted.

In this third embodiment, a latch circuit 310 is inserted between the comparator 142 and the output circuit 144. In case an electrostatic noise which has a larger amplitude than a predetermined voltage, is outputted from the photodiode 116, the latch circuit 310 holds a signal from the comparator 142 at the time, and continuously outputs that signal until the noise is lower than the predetermined value.

Figure 11:
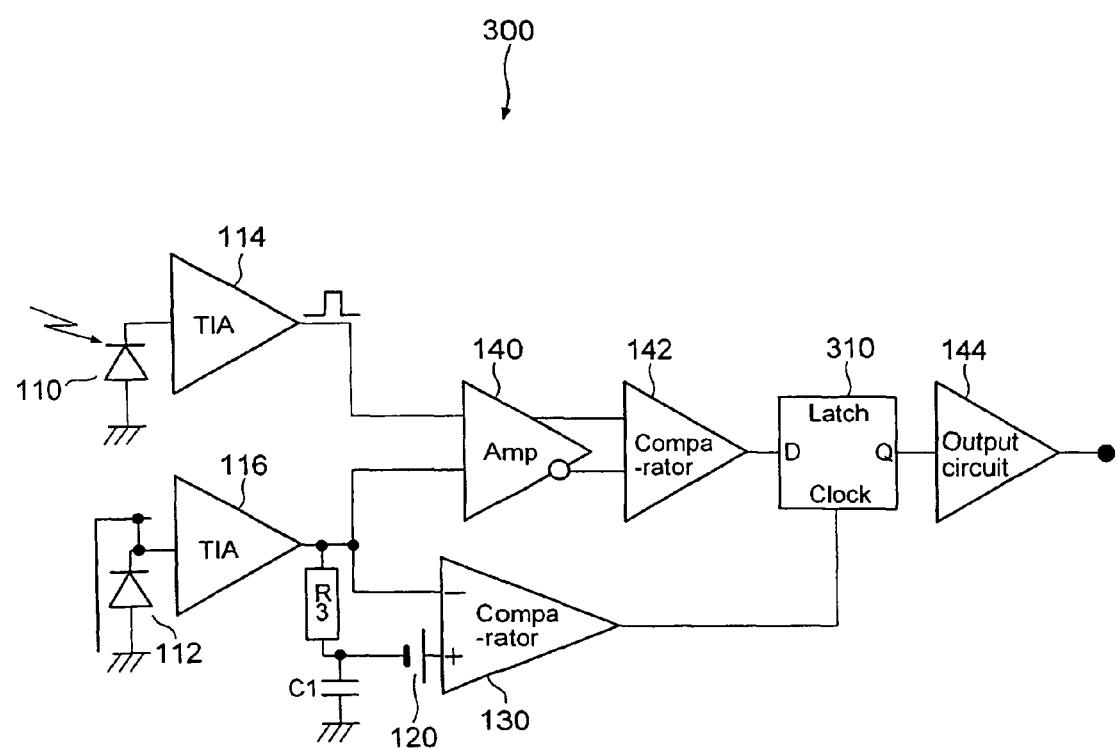
FIG. 11 is a circuit diagram of an optical signal receiving circuit in accordance with a third embodiment of the present invention.

FIG. 11 is a circuit diagram of the optical signal receiving circuit 300 in accordance with a third embodiment of the present invention. The output of the comparator 130 is connected to the clock input terminal of the latch circuit 310. With comparing to the first embodiment, the input terminals are interchanged such that the comparator outputs "1" at a steady state, and outputs "0" when noise is detected. The output of the transimpedance amplifier 116 is connected to the non-inverting terminal, and the positive side of the voltage source 120 is connected to the comparator 130.

In case a positive noise, which swings the output signal of the transimpedance amplifier 114 to a positive direction, is inputted to the photodiodes 110, the substantially same positive direction noise signal is outputted to the output terminal of the transimpedance amplifier 114, 116. If the noise is not so large (or below the predetermined threshold), these noises do not appear at the output of the differential amplifier 140, because of a common mode rejection of the differential amplifier 140.

In this third embodiment, when the output voltage of the transimpedance amplifier 116 is equal to or lower than the threshold voltage of the voltage source 120, the output of the comparator 130 is "1" and the latch circuit 310 outputs the signal inputted from the input terminal D.

When an electrostatic positive direction noise which is larger than a predetermined value and swing to a positive direction, is inputted to the photodiode 112, the voltage signal outputted from the transimpedance amplifier 116 is larger than a threshold voltage of the voltage source 120 and the output of the comparator 130 turns from "1" to "0". In case the signal "0" is inputted to the latch circuit 310, the latch circuit 310 holds a inputted signal from the input terminal D at the time turning to "0", and outputs that inputted signal. The latch circuit 310 holds until the output of the comparator turns from "0" to "1".

Even if the positive direction noise signal which is larger than the output voltage of the transimpedance amplifier 116 (reference terminal of the differential amplifier 140), is outputted from the transimpedance amplifier 114 and the differential amplifier outputs the noise signal, the output of the latch circuit 310 is not changed. So the output circuit 144 may not output noise signal.

Figure 12:
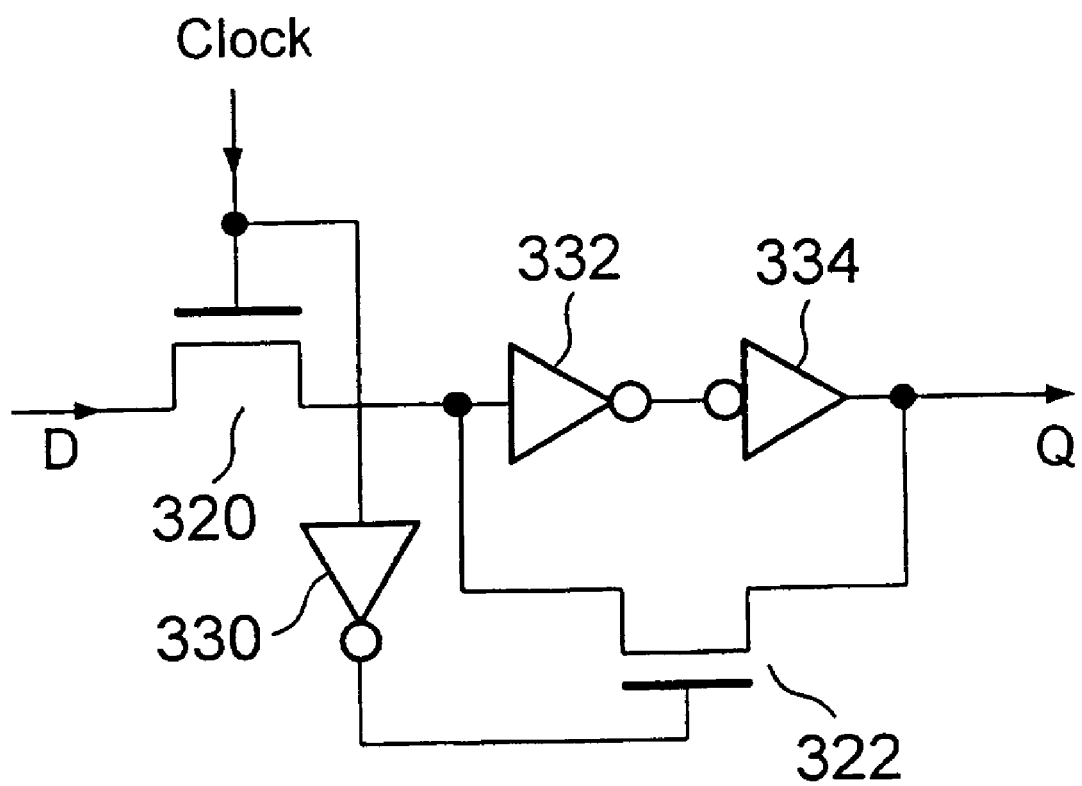
FIG. 12 is a circuit diagram of a latch circuit as shown in FIG. 11.

FIG. 12 is a circuit diagram of a latch circuit as shown in FIG. 11. The latch circuit 310 may have an n type MOSFET 320, 322, and an inverter 330.332 and 334. The circuit configuration of the latch circuit 310 may be as shown in FIG. 12.

Fourth Embodiment

A fourth embodiment is explained with reference to FIG. 13.

An optical signal receiving circuit 400 is described in accordance with a fourth embodiment of the present invention. With respect to each portion of this embodiment, the same or corresponding portions of the optical signal receiving circuit 100, 200 or 300 of the embodiments shown in FIGS. 1-12 are designated by the same reference numerals, and explanation of such portions is omitted.

In this fourth embodiment, the inverting input terminal and the non-inverting terminal are interchanged and the direction of the voltage source 120 is changed, in comparison to the comparator 130 in the third embodiment. So in case a noise, which swings the voltage signal to a negative direction and has greater amplitude than a predetermined threshold voltage is inputted, the latch circuit 310 holds an inputted signal from the input terminal D at the time, and outputs that inputted signal.

Figure 13:
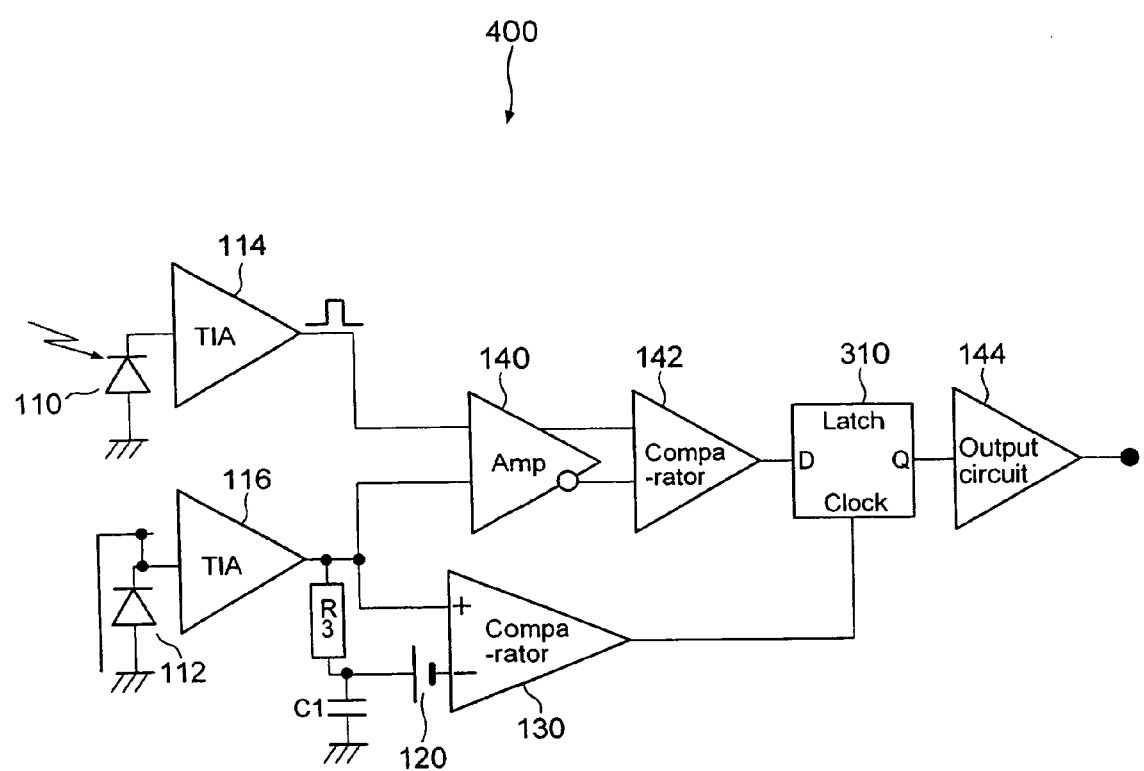
FIG. 13 is a circuit diagram of an optical signal receiving circuit in accordance with a fourth embodiment of the present invention.

FIG. 13 is a circuit diagram of the optical signal receiving circuit 400 in accordance with a fourth embodiment of the present invention. As shown in FIG. 13, the voltage source 120 is connected to an inverting input terminal of the comparator 130, and the output of the transimpedance amplifier 116 is connected to the non-inverting input terminal of the comparator 130. The negative terminal of the voltage source 120 is connected to the inverting input terminal of the comparator 13.

In case a negative noise, which swings the output signal of the transimpedance amplifier 114 to a negative direction, is inputted to the photodiodes 110, substantially the same negative direction noise is outputted to the output terminal of the transimpedance amplifier 114, 116. If the noise is not so large (or below the predetermined threshold), these noises do not appear at the output of the differential amplifier 140, because of a common mode rejection of the differential amplifier 140.

In this fourth embodiment, when the output voltage of the transimpedance amplifier 116 is equal to or lower than the threshold voltage of the voltage source 120, the output of the comparator 130 is "1" and the latch circuit 310 outputs the signal inputted from the input terminal D.

When an electrostatic negative direction noise which is larger than a predetermined value and swings to a negative direction, is inputted to the photodiode 112, the voltage signal outputted from the transimpedance amplifier 116 is larger than a threshold voltage of the voltage source 120 and the output of the comparator 130 turns from "1" to "0". In case the signal "0" is inputted to the latch circuit 310, the latch circuit 310 holds a inputted signal from the input terminal D at the time turning to "0", and outputs that inputted signal. The latch circuit 310 holds until the output of the comparator turns from "0" to "1".

Even if the negative direction noise signal which is larger than the output voltage of the transimpedance amplifier 116 (reference terminal of the differential amplifier 140), is outputted from the transimpedance amplifier 114 and the differential amplifier outputs the noise signal, the output of the latch circuit 310 is not changed. So the output circuit 144 may not output noise signal.

Fifth Embodiment

A fifth embodiment is explained with reference to FIGS. 14-21.

An optical signal receiving circuit 500 is described in accordance with a fifth embodiment of the present invention. With respect to each portion of this embodiment, the same or corresponding portions of the optical signal receiving circuit 100, 200, 300 or 400 of the first to fourth embodiments shown in FIGS. 1-13 are designated by the same reference numerals, and explanation of such portions is omitted.

The optical signal receiving circuit 500 has the function of the optical signal receiving circuit 100 in the first embodiment and the function of the optical signal receiving circuit 200 in the second embodiment. Namely, in case the positive direction noise or the negative direction noise is inputted, the reference terminal of the differential amplifier 140 is pulled up, and the noise is hardly outputted from the differential amplifier 140.

Figure 14:
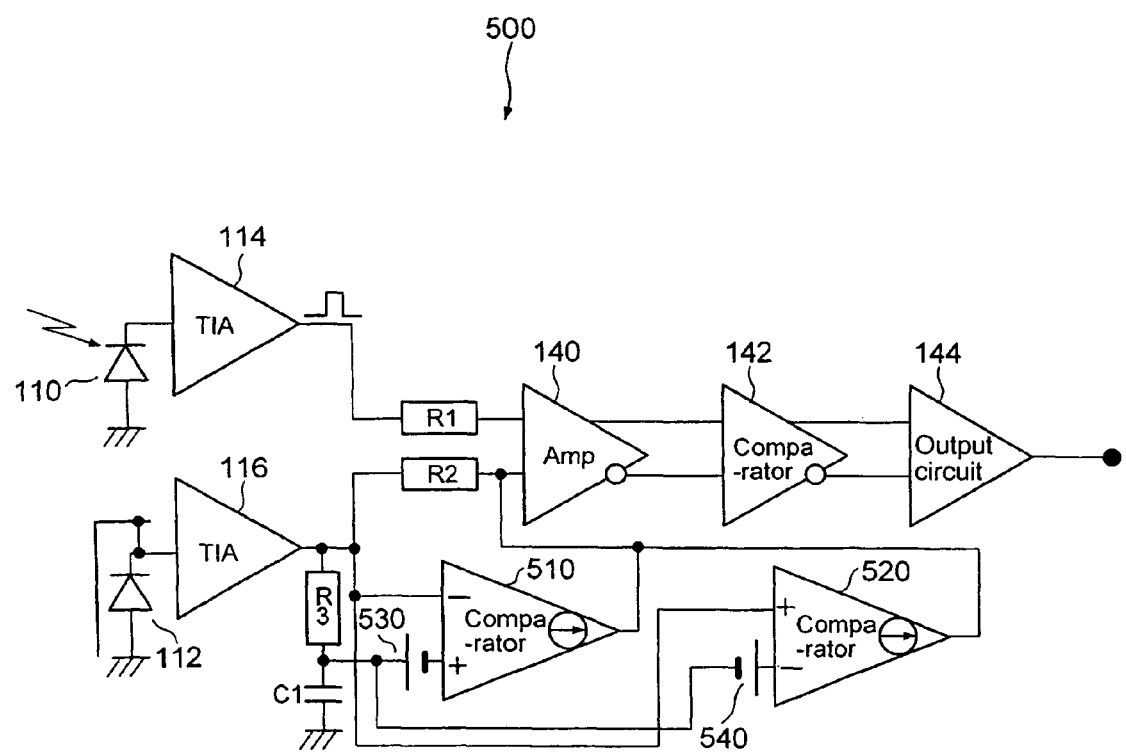
FIG. 14 is a circuit diagram of an optical signal receiving circuit in accordance with a fifth embodiment of the present invention.

As shown in FIG. 14, a comparator 510 and 520 are provided in the optical signal receiving circuit 500. An inverting input terminal of the comparator 510 is connected to the output of the transimpedance amplifier 116, and a non inverting input terminal of the comparator 510 is connected to the negative side of a voltage source 530. A non inverting input terminal of the comparator 520 is connected to the output of the transimpedance amplifier 116, and an inverting input terminal of the comparator 510 is connected to the positive side of a voltage source 540. The comparators 510 and 520 in FIG. 14 are configured to add a current to the reference input terminal of the differential amplifier 140.

When the positive direction noise signal, which is greater than a predetermined threshold voltage is detected, the comparator 520 widens a voltage difference between the output of the transimpedance amplifier 114 and the output of the transimpedance amplifier 116.

When the negative direction noise signal, which is greater than a predetermined threshold voltage is detected, the comparator 510 widens a voltage difference between the output of the transimpedance amplifier 114 and the output of the transimpedance amplifier 116.

So the differential amplifier 140 may not output noise signal, when the positive or negative direction noise is inputted.

Figure 15:
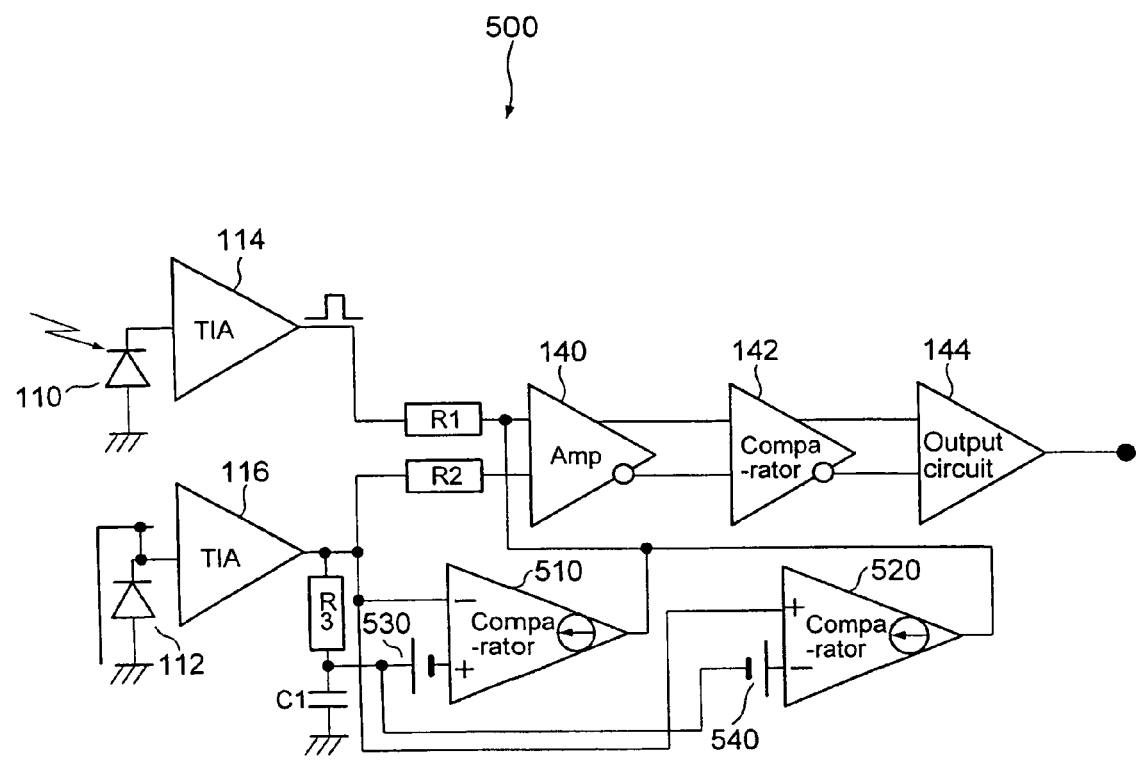
FIG. 15 is a circuit diagram of an optical signal receiving circuit in accordance with a first modification of the fifth embodiment.

FIG. 15 is a circuit diagram of an optical signal receiving circuit in accordance with a first modification of the fifth embodiment.

As shown in FIG. 15, the output terminals of the comparators 510 and 520 are connected to the signal input terminal of the differential amplifier 140, which is provided between the resistance R1 and the differential amplifier 140. The comparators 510 and 520 in FIG. 15 are configured to extract current from the signal input terminal of the differential amplifier 140.

When the positive or negative direction noise signal, which is greater than a predetermined threshold voltage is detected, the comparator 520 widens a voltage difference between the output of the transimpedance amplifier 114 and the output of the transimpedance amplifier 116.

FIG. 16 is a circuit diagram of an optical signal receiving circuit 500 in accordance with a second modification of the fifth embodiment. FIG. 17 is a circuit diagram of an optical signal receiving circuit 500 in accordance with a third modification of the fifth embodiment.

As shown in FIGS. 16 and 17, it may be available that one of the output terminals of the comparator 510 and 520 is connected to the reference terminal of the differential amplifier 140, and the other one is connected to the signal terminal of the differential amplifier 140. In this case one of the comparators 510 and 520 is configured to add a current to the reference terminal of the differential comparator 140 and the extract a current from the signal terminal of the differential comparator 140.

It may be applicable to an optical receiving circuit, in which the output of the transimpedance amplifiers 114, 116 drops when the photodiodes 110, 112 detects the light of the optical signal.

The optical receiving circuit 500 as shown in FIG. 18 corresponds to the optical receiving circuit 500 shown in FIG. 14. The optical receiving circuit 500 as shown in FIG. 19 corresponds to the optical receiving circuit 500 shown in FIG. 15. The optical receiving circuit 500 as shown in FIG. 20 corresponds to the optical receiving circuit 500 shown in FIG. 16. The optical receiving circuit 500 as shown in FIG. 21 corresponds to the optical receiving circuit 500 shown in FIG. 17.

Sixth Embodiment

A sixth embodiment is explained with reference to FIG. 22.

An optical signal receiving circuit 600 is described in accordance with a sixth embodiment of the present invention. With respect to each portion of this embodiment, the same or corresponding portions of the optical signal receiving circuit 100, 200, 300, 400 or 500 of the first to fifth embodiments shown in FIGS. 1-21 are designated by the same reference numerals, and explanation of such portions is omitted.

In this sixth embodiment, the optical signal receiving circuit 600 has a latch circuit, which holds input signal when the electrostatic noise is a positive direction noise and a negative direction voltage. With comparing to the third and the fourth embodiments, the latch circuit holds when the electrostatic noise is a positive direction noise or a negative direction voltage.

FIG. 22 is a circuit diagram of an optical signal receiving circuit in accordance with a sixth embodiment of the present invention. The optical signal receiving circuit 600 has a comparator 610 and 620.

A non inverting input terminal of the comparator 610 is connected to the output of the transimpedance amplifier 116, and an inverting input terminal of the comparator 610 is connected to the negative side of a voltage source 630. An inverting input terminal of the comparator 620 is connected to the output of the transimpedance amplifier 116, and a non inverting input terminal of the comparator 620 is connected to the positive side of a voltage source 640.

The output terminals of the comparators 610 and 620 are connected to an input terminal of the OR circuit 650. An output terminal of the OR circuit 650 is connected to the clock terminal of the latch circuit 310.

The latch circuit 310 outputs the same signal as the inputted signal from the terminal D, when the signal inputted from the Clock terminal is "1". The latch circuit 310 holds the inputted signal from the terminal D at the time turning to "0", and output that signal until the signal from the Clock terminal turns to "1".

In this embodiment, in case the positive or negative direction noise signal, which is greater than a predetermined threshold voltage is detected, the signal inputted from the clock terminal of the latch circuit 310 is "0" and the output signal is held, when the positive or negative direction noise is detected. So noise signal, which is positive noise or negative noise, is hardly outputted from the output circuit 144.

Embodiments of the invention have been described with reference to the examples. However, the invention is not limited thereto.

For example, in these embodiments, the resistance R3 and the capacitance C1 are an example of the high cut filter. The high cut filter is not limited to that structure. The voltage source 120 may be not common connected to the high cut filter. It may be available that the voltage source is not connected to the high cut filter and the voltage source is inputted to the reference voltage input.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An optical signal receiving circuit, comprising:
    a first transimpedance amplifier configured to convert a first current signal into a first voltage signal, wherein the first current signal is generated in a first photodiode, to which an optical signal is input;
    a second transimpedance amplifier configured to convert a second current signal into a second voltage signal, wherein the second current signal is generated in a second photodiode, to which an optical signal is input;
    a noise detection circuit configured to detect a noise signal of the second voltage signal, and configured to shift at least one of the first voltage and the second voltage to widen a voltage difference between the first voltage signal and the second voltage signal when the noise signal of the second voltage signal is detected; and
    a first comparator having as inputs the first voltage signal and the second voltage signal, and configured to generate a digital signal based on the first voltage signal and the second voltage signal,
    wherein the noise detection circuit includes:
        a reference voltage generation circuit configured to generate a reference voltage, and
        a second comparator that receives the second voltage signal at a first input terminal and that receives the reference voltage at a second input terminal;

wherein the reference voltage generation circuit includes:
   a resistance connected between the output terminal of the second transimpedance amplifier and a node,
   a capacitance connected between a reference terminal and the node, and
   a voltage source connected between the node and second input terminal of the second comparator.

2. An optical signal receiving circuit of claim 1, wherein the noise detection circuit is configured to shift at least one of the first voltage signal and the second voltage signal when the noise detection circuit detects a noise having an amplitude greater than a predetermined value.

3. An optical signal receiving circuit of claim 1, wherein an output terminal of the second comparator is connected to an input terminal of the first comparator for the first voltage signal.

4. An optical signal receiving circuit of claim 1, wherein an output terminal of the second comparator is connected to an input terminal of the first comparator for the second voltage signal.

5. An optical signal receiving circuit of claim 1, wherein an output terminal of the second comparator is connected to an input terminal of a latch circuit, which ratches the digital signal.

* * * * *